United States Patent [19]

Egli et al.

[11] Patent Number: 4,600,883
[45] Date of Patent: Jul. 15, 1986

[54] APPARATUS AND METHOD FOR DETERMINING THE RANGE AND BEARING IN A PLANE OF AN OBJECT CHARACTERIZED BY AN ELECTRIC OR MAGNETIC DIPOLE

[75] Inventors: Werner H. Egli, Minneapolis; James E. Lenz, Brooklyn Park, both of Minn.

[73] Assignee: Honeywell Inc., Minneapolis, Minn.

[21] Appl. No.: 534,448

[22] Filed: Sep. 21, 1983

[51] Int. Cl.[4] .................. G01R 33/02; G06G 7/78; G01B 7/14; G05F 1/00

[52] U.S. Cl. .................. 324/207; 89/41.17; 318/647; 324/246; 364/444

[58] Field of Search .............. 324/207, 208, 244–247, 324/260, 72, 345, 326, 457; 33/355 R, 361, 362; 364/444, 449, 432, 434, 435; 318/647; 89/41.17, 41.19, 41.21, 41.22

[56] References Cited

U.S. PATENT DOCUMENTS

| | | |
|---|---|---|
| 3,061,239 | 10/1962 | Rusk . |
| 3,644,825 | 2/1972 | Davis, Jr. et al. . |
| 3,728,525 | 3/1973 | Adkar . |
| 4,267,640 | 5/1981 | Wu ........................ 33/361 |
| 4,287,809 | 9/1981 | Egli et al. ................ 324/260 X |
| 4,302,746 | 11/1981 | Scarzello et al. ........ 324/247 X |
| 4,314,251 | 2/1982 | Raab ....................... 324/247 X |
| 4,427,943 | 1/1984 | Cloutier et al. .......... 324/345 X |
| 4,438,401 | 3/1984 | Iwamoto et al. ......... 324/247 X |
| 4,470,013 | 9/1984 | Posseme ................... 324/247 X |
| 4,480,226 | 10/1984 | Kuno et al. .............. 324/247 |

Primary Examiner—Gerard R. Strecker
Attorney, Agent, or Firm—William T. Udseth

[57] ABSTRACT

Orthogonal components of electromagnetic field perturbations due to objects characterized by electric or magnetic dipoles are measured along orthogonal axes in a plane. The components are proportional with ($3 \cos^2 \theta - 1$) and ($3 \cos \theta \sin \theta$), where $\theta$ is the bearing of the dipole center relative to the device for measuring the field components. $\theta$ is readily determined from these equations and the range of the object can also be determined from knowledge of the dipole moment.

8 Claims, 7 Drawing Figures

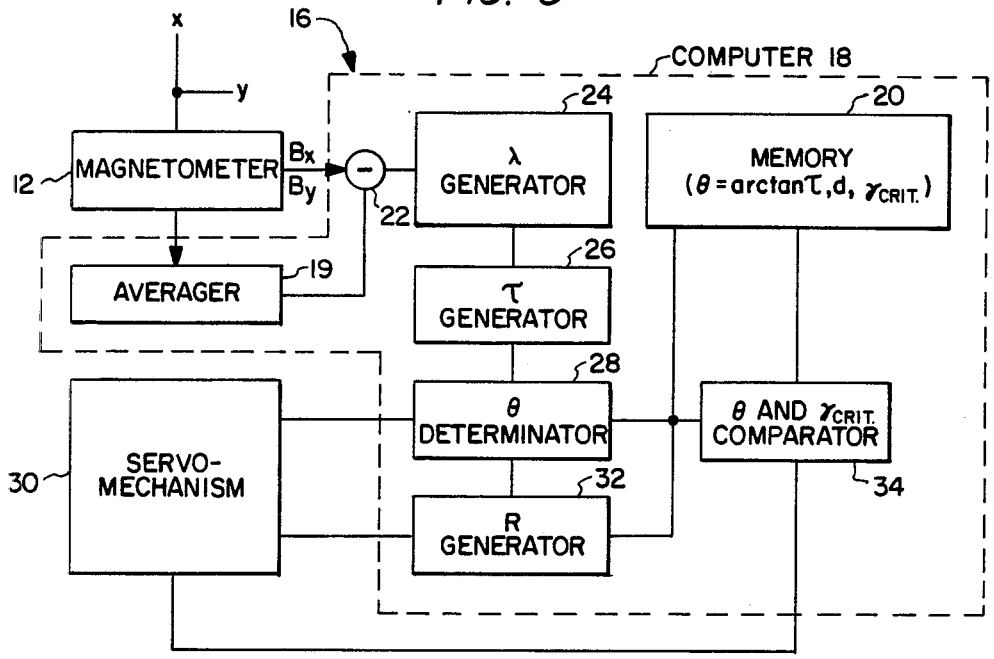
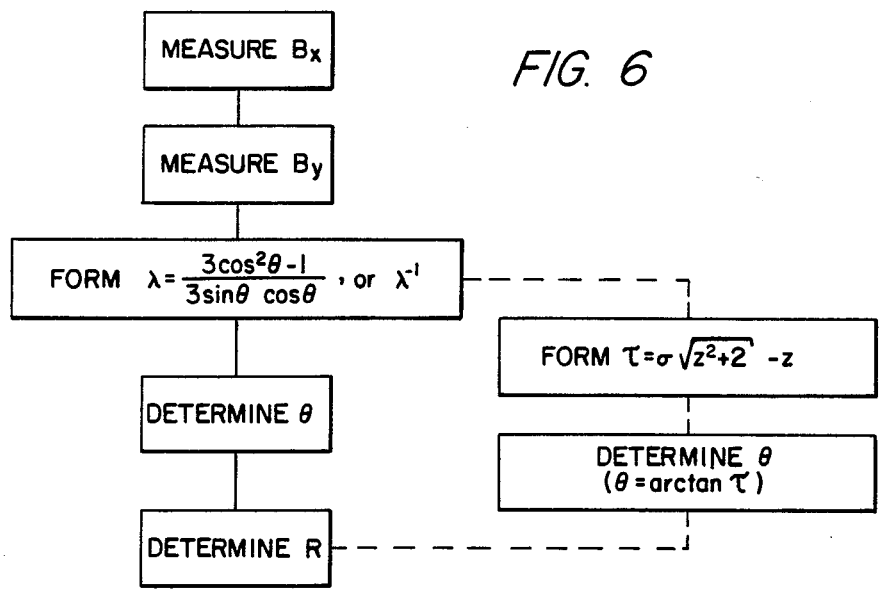

APPARATUS AND METHOD FOR DETERMINING THE RANGE AND BEARING IN A PLANE OF AN OBJECT CHARACTERIZED BY AN ELECTRIC OR MAGNETIC DIPOLE

BACKGROUND OF THE INVENTION

1. Field of the Invention

This invention relates to means and methods for determining magnetic and electric fields using gradiometers, magnetometers, or electrometers. More particularly, perturbations in magnetic and electric fields due to magnetic or electric dipoles are sensed with electric or magnetic gradiometers.

2. Prior Art

Many devices for measuring magnetic field direction, locating objects or determining the orientation of an object by measuring electromagnetic fields have been proposed. Among these are U.S. Pat. Nos. 3,061,239 to S. J. Rusk, 3,644,825 to P.D. Davis, Jr. et al, 3,728,525 to C. K. Adkar, 4,267,640 to C. T. Wu, 4,287,809 to W. H. Egli, et al, 4,302,746 to J. F. Scarzello, et al and 4,314,251 to F. H. Raab.

Raab uses generalized matrix formulations as the basis for a system of radiating and receiving antennas which determine the position and orientation of a remote object. The transmitter employs two orthogonal radiating antennas and the receiver has three mutually orthogonal receiving antennas. The transmitting antennas should be magnetic dipole sources. Raab discloses only the intentional excitation of transmission loops by periodic signals. His equations for determining position and orientation are of the most general form (e.g. equation 27 is a general product matrix for three orthogonal rotations) and are quite complex.

Similarly the Egli, et al patent determines orientation and position of a helmet with a system having transmitting and receiving antennas by employing generalized matrix formulations.

Rusk discloses a static magnetic moment device for maintaining a satellite in a predetermined orientation with respect to its orbit about the earth. Rusk makes use of the torque produced by the magnetic interaction between the earth's magnetic field and a predetermined magnetic field developed on the satellite in response to attitude control signals derived from conventional vehicle attitude detection devices. Three mutually perpendicular magnetic torquing coils are utilized.

Wu measures a magnetic field with crossed rods each having a rectangular shaped B-H hysteresis curve. The earth's field biases each rod so that the B field of each will switch between a high and low state with voltages in direct proportion to the component of the earth's field line along each rod.

Scarzello, et al uses a two axis magnetometer to sense a vehicle's magnetic signature. Standard two axis magnetometers or gradiometers with windings on ring cores are integrated in a system to sense the arrival and exit of a vehicle at a fixed location. Comparisons to predetermined thresholds are made to screen against electromagnetic interference effects and false alarms.

Adkar determines the geographical location of an object on the earth by imposing known perturbations of magnetic flux first on the vertical component of the earth's field and then on an orthogonal component lying in a horizontal plane at the earth's surface. Knowledge of total field strength allows the determination of location, inclination and azimuth.

Davis, Jr., et al uses two magnetic field sensors to generate output signals representative of perpendicular directional components of a varying magnetic field. Each output signal is differentiated and circuitry multiplies each output signal by the differential of the other output signal. The multiplication products are substracted to produce a resultant signal. The polarity and magnitude of the resultant signal is sensed to determine either direction of movement of the object creating the magnetic field, or to indicate the relative position of the object with respect to the sensors if the direction of movement of the object is known.

Also known are the field equations for magnetic induction $\vec{B}(r)$ due to a magnetic dipole, i.e.:

$$\vec{B}(\vec{r}) = \frac{3\vec{u}(\vec{u}\cdot\vec{m}) - \vec{m}}{|\vec{r}|^3} \tag{1}$$

where $\vec{r}$ is the direction vector between an origin on the dipole and the point of observation, $\vec{u}$ is a unit vector from the origin in the direction of $\vec{r}$ and $\vec{m}$ is the magnetic moment defined by:

$$\vec{m} = \frac{1}{2c} \int \vec{r} \times \vec{J}(r') d^3\vec{r} \tag{2}$$

for a current distribution $\vec{J}$ (see FIG. 1). For a ferromagnetic material $\vec{m}$ is the sum of a permanent magnetic moment and an induced magnetic moment.

Similar equations hold for the electric field $\vec{E}(\vec{r})$ due to a dipole of electric dipole moment $\vec{p}$, i.e.

$$\vec{E}(\vec{r}) = \frac{3\vec{u}(\vec{u}\cdot\vec{p}) - \vec{p}}{|\vec{r}|^3} \tag{3}$$

and $$\vec{p} = \int \vec{r} \rho(\vec{r}) d^3\vec{r} \tag{4}$$

where $\rho$ is a charge distribution.

None of the above systems provide for the determination in a plane (from two orthogonal magnetic field components due to the perturbation of an external magnetic field by the magnetic dipole) of the angular orientation of a magnetic dipole relative to a point of observation with a single equation having one independent variable. Nor do such prior art systems provide for the same determination from perturbations of an electric field due to an electric dipole.

SUMMARY OF THE INVENTION

This invention discloses a method of determining, with a device for measuring magnetic field perturbation, the bearing $\theta$ of a ferromagnetic material located in a region subject to an external magnetic field of known strength and direction within the region, where $\theta$ is the angle between a line from the measuring device to the location of the ferromagnetic material and a first direction, the first direction being the direction of the external magnetic field at the location of the ferromagnetic material, comprising: determining a first component of the perturbation of the external magnetic field at the site of the measuring device along the first direction, determining a second component of the perturbation of the external magnetic field at the site of the measuring device along a direction orthogonal to the first direction and lying in the plane, forming a first equation by setting the first component equal to $(3\cos^2\theta - 1)$, forming a second equation by setting the second component equal to $(3\cos\theta\sin\theta)$, forming a ratio of the first and second equations thereby yielding a third equation, and determining $\theta$ from the third equation.

Similar methods, where perturbations of an external electric field due to an electric dipole provide the first and second components, are also disclosed.

Means corresponding to the above methods comprise further aspects of the invention.

BRIEF DESCRIPTION OF THE DRAWINGS

FIG. 5 illustrates a device according to the present invention.

FIG. 6 illustrates two alternative methods of the present invention.

DESCRIPTION OF THE PREFERRED EMBODIMENT

Figure 2B:
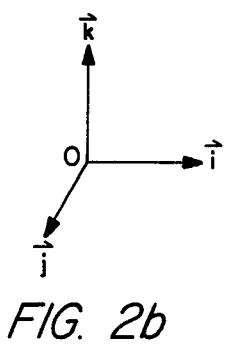
FIG. 2B indicates unit vectors lying along the coordinate axes of FIG. 2A.
Figure 2A:
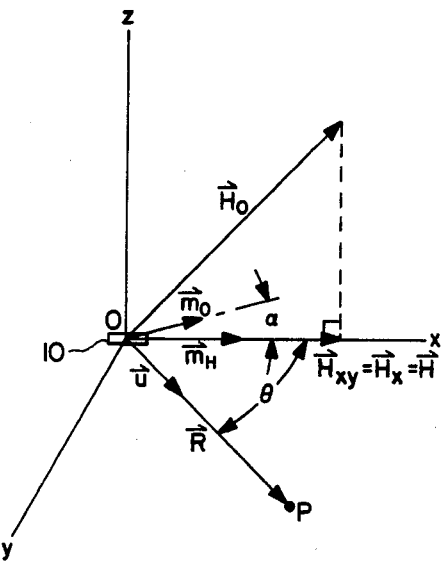
FIG. 2A indicates the coordinate system used to describe the present invention.

The Cartesian coordinates x,y,z of FIG. 2A with Origin O (and unit vectors $\vec{i},\vec{j},\vec{k}$ of FIG. 2B) are selected with the x,y, plane forming the plane in which measurements are made. O is located within the boundries of a ferromagnetic material, current distribution or charge distribution (identified in FIG. 2A as object 10). For distances far enough away from object 10, (i.e., generally at least several radii of object 10), the magnetic or electric field due to object 10 can be characterized as an electric dipole field (for a charge distribution) or a magnetic dipole field (for current distributions and material which will form induced magnetic dipoles or possess permanent magnetic dipoles). For simplicity, the dipole moment of the electric or magnetic field is chosen to coincide with the x axes. In FIG. 2a, for illustrative purposes, a magnetic dipole moment $\vec{m}_H$ is depicted. The direction of $\vec{m}_H$ will in general form an angle $\theta$ in the x-y plane with a line from O to a point P at which field readings will be taken. The cord OP is defined as $\vec{R}$.

Figure 1:
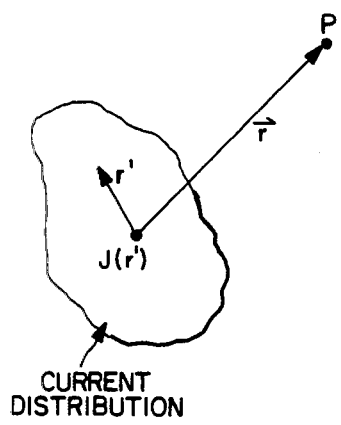
FIG. 1 illustrates the geometry for calculating a current distribution.

For ferromagnetic materials and current distributions, $\vec{m}_H$ represents the induced magnetic dipole due to an external magnetic field $\vec{H}_o$. Cartesian coordinates are chosen in FIG. 1 so that $\vec{H}_o$ lies in the x-z plane, which is physically consistent with selecting $\vec{m}_H$ to lie along the x axis. The magnetic field in the x-y plane ($\vec{H}_{xy}$) thus reduces to the x component of $\vec{H}_o$ (i.e., $\vec{H}_x$). When object 10 is a ferromagnetic material, $\vec{m}_H$ may not be the only magnetic dipole component. Particularly in objects including "hard iron", in addition to $\vec{m}_H$ there will be a permanent magnetic dipole moment having a component $\vec{m}_o$ in the x-y plane. In general the direction of $\vec{m}_o$ and $\vec{m}_H$ will form an angle $\alpha$ in the x-y plane. The analysis below assumes $\vec{m}_H$ is much larger than $\vec{m}_o$. $\vec{H}$ will be used for $\vec{H}_x$ for simplicity. The magnetic dipole case will be discussed first with the electric dipole case addressed later.

A ferromagnetic material (i.e., object 10) is modeled thus: under an external magnetic field $\vec{H}$, object 10 "resonates" and becomes a magnetic dipole of value:

$$\vec{m} = \vec{H}_o d^3 \tag{5}$$

where d represents the characteristic magnetic diameter of object 10 and is given by:

$$d^3 = \frac{V(\mu - 1)}{4\pi} \cdot \frac{1}{1 + (\mu - 1)N/4\pi} \tag{6}$$

where
  V = volume of object 10,
  $\mu$ = magnetic permeability and
  $N/4\pi$ = demagnetizing factor.

Assume object 10 to be confined to the x-y lane and $\vec{H}$ is the x-y component of $\vec{H}_o$. Then, from equation 1, the field perturbation $\vec{f}$ sensed by a magnetometer 12 (see FIG. 3) at point P a distance $R = |\vec{R}|$ from object 10 is:

$$\vec{f} = \frac{d^3}{R^3}(3u\vec{u} - I)\vec{H} \tag{7}$$

where:
  $\vec{u}$ = unit vector along $\vec{R}$
  $u\vec{u}$ = "outer-square" of u, a symmetric matrix
and
  I = identity matrix.

Since $\vec{H}$ equals $\vec{i}H$, equation 4 becomes:

$$\vec{f} = \frac{Hd^3}{R^3}(3\vec{u}(\vec{u}\cdot\vec{i}) - \vec{i}) \tag{8}$$

Further, because $$\vec{u} = \vec{i}\cos\theta + \vec{j}\sin\theta \tag{9}$$

and $$\vec{u}\cdot\vec{i} = \cos\theta \tag{10}$$

equation 5 becomes:

$$\vec{f} = Hd^3/R^3(\vec{i}(3\cos^2\theta - 1) + \vec{j}\,3\cos\theta\sin\theta) \tag{11}$$

One can solve for $\theta$ in terms of the ratio of $\vec{i}$ and $\vec{j}$ components of $\vec{f}$ as follows:

$$\lambda = \frac{3\cos^2\theta - 1}{3\sin\theta\cos\theta} \tag{12}$$

which leads to:

$$\tau^2 + 3\lambda\tau - 2 = 0 \tag{13}$$

where $\tau = \tan\theta$.

The solution for $\tau$ is thus:

$$\tau = \sigma\sqrt{Z^2 + 2} - Z \tag{14}$$

where $$Z = \frac{3\lambda}{2}$$

$\sigma$ = sign of $\vec{f}\cdot\vec{j}$
Of course $$\theta = \arctan\tau \tag{15}$$

and $\sin\theta$ and $\cos\theta$ are given by $$\sin\theta = \tau/\sqrt{1+\tau^2} \tag{16}$$

and $$\cos\theta = 1/\sqrt{1+\tau^2}. \tag{17}$$

Note that equation 12 could be formed as $\lambda^{-1}$, then Z in equation 14 would be $3/(2\lambda)$.

If d is known, equation 8 will readily yield R from:

$$f^2 = \left(\frac{Hd^3}{R^3}\right)^2 (3\cos^2\theta + 1). \tag{18}$$

Thus $$R = \left[\frac{H^2 d^6}{f^2}(3\cos^2\theta + 1)\right]^{1/6}. \tag{19}$$

Denoting magnetic field perturbations in the x and y directions due to object 10 as $\vec{B}_x$ and $\vec{B}_y$, respectively, from equation 8:

$$\vec{B}_x = \frac{\vec{m}_H(3\cos^2\theta - 1)}{R^3} \tag{20}$$

and $$\vec{B}_y = \frac{3\vec{m}_H \sin\theta \cos\theta}{R^3}. \tag{21}$$

R and $\theta$ for electric field perturbations due to a charge distribution can be computed by the same analysis employing equation 3 and 4. R and $\theta$ for current distributions are similarly determined using equation 2.

Figure 4:
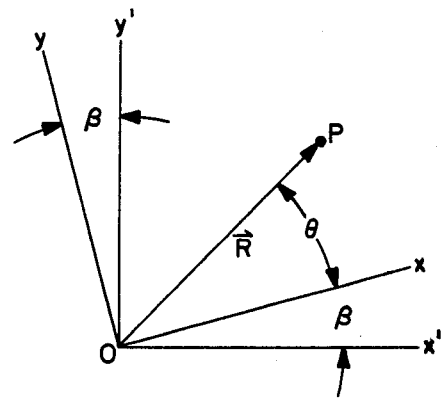
FIG. 4 illustrates a refinement in the coordinate system used to describe the present invention.

Typically, a two axis magnetometer would be used to measure $\vec{B}_x$ and $\vec{B}_y$. If a first axis of the magnetometer is aligned with $\vec{H}$, then (for example) $\vec{B}_x$ equals $\vec{H}$. If the first axis and $\vec{H}$ form an angle $\beta$, where the first axis lies along a direction x' and $\vec{H}$ lies along the x axis, $\vec{H}$ could be resolved into components along x and y or a standard coordinate transformation between x' and x would be employed (see FIG. 4). In order for two axis magnetometer 12 to measure field perturbations, the horizontal external field components (i.e., $\vec{H}x$ and $\vec{H}y$) at 0 prior to the presence of object 10 must be known and substracted from measurements of $\vec{B}x$ and $\vec{B}y$ when object 10 is present. It is also possible to adapt a magnetic gradiometer to measure field perturbation components directly.

Figure 3:
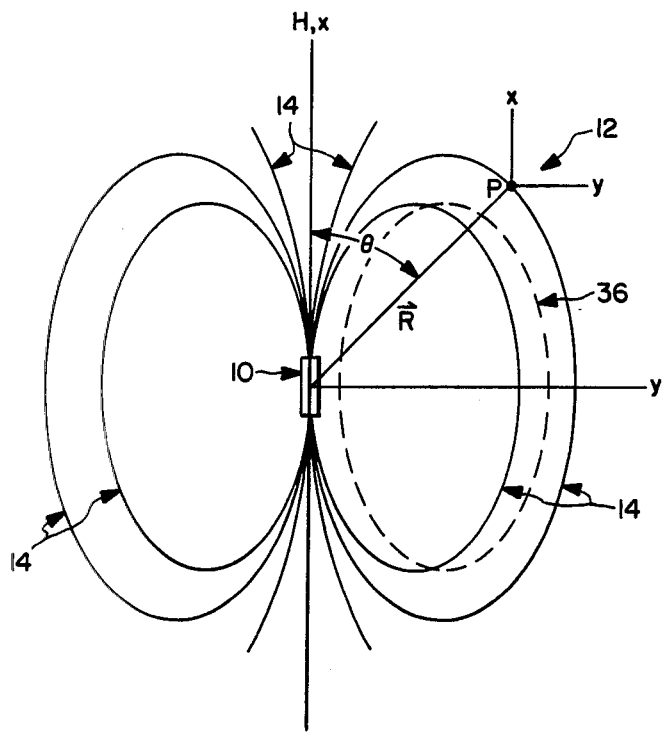
FIG. 3 is a schematic representation of a portion of a dipole field due to an electric or magnetic dipole.

FIG. 3 shows a schematic of a typical plot of magnetic field lines 14 representing perturbations in the external magnetic field $\vec{H}$ due to the induced magnetic dipole $\vec{m}_H$ of object 10.

Measurements can be made with $\beta$ being nonzero but for convenience an axis of magnetometer 12 will be aligned with the x axis so that $\beta$ is zero. This simplifies the equations.

An example of a device 16 to generate $\theta$ and R employing measuring device 12 is shown in FIG. 5. Measuring device 12 (for magnetic fields it is preferably a magnetometer) measures components $\vec{H}x$ and $\vec{H}y$ with object 10 not present and with object 10 present. Computer 18 retains the unperturbated values of $<\vec{H}x>$ and $<\vec{H}y>$ in averager 19 (or its main memory 20). Computer 18 employs substractor 22 to subtract the unperturbated values of $<\vec{H}x>$ and $<\vec{H}y>$ from the values of $\vec{H}x$ and $\vec{H}y$, respectively, with object 10 present. This yield $\vec{B}x$ and $\vec{B}y$, the perturbated field components. Computer 18 further includes $\lambda$ generator 24, $\tau$ generator 26 and $\theta$ determinator 28. $\lambda$ is found directly from $\vec{B}_x$ and $\vec{B}_y$ and $\tau$ is found directly from $\tau$. A convenient way to determine $\theta$ is to employ a lookup table approach. Memory 20 will then contain values for arctan $\tau$ in memory 20. Once $\theta$ is known, servomechanism 30 can be adapted to perform a variety of functions.

R is provided by R generator 32 from a knowledge of $\theta$ and d. Again memory 20 can hold values for d for an object 10 having a known magnetic characteristic diameter or being of an expected magnetic characteristic diameter. Servomechanism 30 can be employed to perform a variety of functions dependent on the value of R.

In weapon systems applications, servomechanism 30 can be adapted to fire a weapon (not shown) along a direction determined by $\theta$, or provide an omnidirectional blast at a range R or fire a weapon along a direction and at a range determined by $\theta$ and R. A triggering mode can be provided by aligning a weapon along a critical angle with respect to the direction of $\vec{H}$. That angle would be identified as $\gamma$ crit. When $\theta$ equals $\gamma$ crit, servomechanism 30 could activate a weapon. Comparator 34 can be employed to compare $\theta$ to $\gamma$ crit. Similarly a critical range (R crit) could be used to trigger an omnidirectional blast when R equals R crit.

The lookup approach depicted in FIG. 5 is only one method of computing $\theta$. Computer 18 could, for example, compute $\theta$ directly from $\lambda$ using an iterative process.

A method of determining R and $\theta$ is summarized in FIG. 6. The step of determining $\theta$ directly from $\lambda$ is shown (in the righthand column of FIG. 6) to be alternatively accomplished by first generating $\tau$.

In the above discussion it was assumed that the magnitude and direction of $\vec{H}$ is substantially constant over the region including object 10 and magnetometer 12. This allowed $\vec{H}$ to be set equal to $i\vec{H}$ in equation (8). If there is some variance between the direction or magnitude of $\vec{H}$ at the location of object 10 and at the site of magnetometer 12, it is preferable to use the method of the present invention to determine a first value of R and $\theta$ with $\vec{H}$ equal to $\vec{H}$ at the site of magnetometer 12. Since it is assumed that the magnitude and direction of $\vec{H}$ is known at all points, the value of $\vec{H}$ at this first location defined by R and $\theta$ is known and is then used to compute a second R and $\theta$. The process can be repeated in an iterative manner for further accuracy with the value of $\vec{H}$ for each new computation being the value of $\vec{H}$ at the location determined by the last computed values of R and $\theta$.

If $\vec{m}_H$ is not much larger than $\vec{m}_o$, the true magnetic field lines (see 36 in FIG. 4) due to object 10 will not coincide with lines 14. In that event the net magnetic dipole will be represented by the vector sum of $\vec{m}_o$ and $\vec{m}_H$. In general, the net magnetic dipole moment will form an angle in the x-y plane with $\vec{H}$. A dipole field will still be generated, however the angle between the magnetic dipole moment and the component of $\vec{H}_o$ in the xy plane will not be known. The device and method of the present invention can still be employed to determine the true locations of the center of the dipole by passively tracking over time, the curvature (i.e., $|\vec{B}_x|/|\vec{B}_y|$) of the perturbated field line with measuring device 12. Given this tracking information, the data can be fitted to curves representing different dipole models so that the true center of the dipole characterizing object 10 can be more accurately determined.

We claim:

1. A method of determining with a device for measuring magnetic field perturbations the bearing $\theta$ in a plane of a ferromagnetic material located in a region subject to an external magnetic field of known strength and direction within said region, where $\theta$ is the angle between a line from said measuring device to the location of said ferromagnetic material and a first direction, said first direction being the direction of said external magnetic field in said plane at the location of said ferromagnetic material, comprising:

determining a first component in said plane of the perturbation of said external magnetic field at the site of said measuring device along said first direction;

determining a second component in said plane of the perturbation of said external magnetic field at the site of said measuring device along a second direction in said plane, wherein said second direction is orthogonal to said first direction;

forming a first equation by setting said first component proportional to $(3 \cos^2 \theta - 1)$;

forming a second equation by setting said second component proportional to $(3 \sin \theta \cos \theta)$;

forming a ratio of said first and second equations thereby yielding a third equation; and utilizing said third equation to determine $\theta$.

2. A method of determining with a device for measuring magnetic field perturbations the bearing $\theta$ in a plane of an electric current distribution located in a region subject to an external magnetic field of known strength and direction within said region where $\theta$ is the angle between a line from said measuring device to the location of said electric current distribution and a first direction, said first direction being the direction of said external magnetic field in said plane at the location of said electric current distribution, comprising:

determining a first component in said plane of the perturbation of said external magnetic field at the site of said measuring device along said first direction;

determining a second component in said plane of the perturbation of said external magnetic field at the site of said measuring device along a second direction in said plane, wherein said second direction is orthogonal to said first direction;

forming a first equation by setting said first component proportional to $(3 \cos^2 \theta - 1)$;

forming a second equation by setting said second component proportional to $(3 \sin \theta \cos \theta)$;

forming a ratio of said first and second equations thereby yielding a third equation; and utilizing said third equation to determine $\theta$.

3. A method of determining with a device for measuring electric field perturbations the bearing $\theta$ in a plane of an electric charge distribution located in a region subject to an external electric field of known strength and direction within said region, where $\theta$ is the angle between a line from said measuring device to the location of said charge distribution and a first direction, said first direction being the direction of said external electric field in said plane at the location of said charge distribution, comprising:

determining a first component in said plane of the perturbation of said external electric field at said the site of said measuring device along said first direction;

determining a second component in said plane of the perturbation of said external electric field at the site of said measuring device along a second direction in said plane, wherein said second direction is orthogonal to said first direction;

forming a first equation by setting said first component proportional to $(3 \cos^2 \theta - 1)$;

forming a second equation by setting said second component proportional to $(3 \sin \theta \cos \theta)$;

forming a ratio of said first and second equations thereby yielding a third equation;

utilizing said third equation to determine $\theta$.

4. An apparatus for determining the bearing $\theta$ in a plane of a ferromagnetic material located in a region subject to an external magnetic field of known strength and direction within said region, where $\theta$ is, the angle between a line from a point in said plane to the location of said ferromagnetic material and a first direction, said first direction being the direction of said external magnetic field in said plane at the location of said ferromagnetic material, comprising:

means for determining a first component in said plane of the perturbation of said external magnetic field at said point along said first direction;

means for determining a second component in said plane of the perturbation of said external magnetic field at said point along a second direction in said plane, wherein said second direction is orthogonal to said first direction;

means for forming a first equation by setting said first component proportional to $(3 \cos^2 \theta - 1)$;

means for forming a second equation by setting said second component proportional to $(3 \sin \theta \cos \theta)$;

means for forming a ratio of said first and second equations thereby yielding a third equation;

means for utilizing said third equation to determine $\theta$.

5. An apparatus for determining the bearing $\theta$ in a plane of an electric current distribution located in a region subject to an external magnetic field of known strength and direction with in said region, where $\theta$ is the angle between a line from a point in said plane to the location of said electric current distribution and a first direction, said first direction being the direction of said external magnetic field in said plane at the location of said electric current distribution, comprising:

means for determining a first component in said plane of the perturbation of said external magnetic field at said point along said first direction;

means for determining a second component in said plane of the perturbation of said external magnetic field at said point along a second direction in said plane, wherein said second direction is orthogonal to said first direction;

means for forming a first equation by setting said first component proportional to $(3 \cos^2 \theta - 1)$;

means for forming a second equation by setting said second component proportional to $(3 \sin \theta \cos \theta)$;

means for forming a ratio of said first and second equations thereby yielding a third equation;

means for utilizing said third equation to determine $\theta$.

6. An apparatus for determining the bearing $\theta$ in a plane of an electric charge distribution located in a region subject to an external electric field of known strength and direction within said region, where $\theta$ is the angle between a line from a point in said plane to the location of said charge distribution and a first direction, said first direction being the direction of said external electric field in said plane at the location of said charge distribution, comprising:

means for determining a first component in said plane of the perturbation of said external electric field at said point along said first direction;

means for determining a second component in said plane of the perturbation of said external electric field at said point along a second direction in said plane, wherein said second direction is orthogonal to said first direction;

means for forming a first equation by setting said first component proportional to $(3 \cos^2 \theta - 1)$;

means for forming a second equation by setting said second component proportional to $(3 \sin \theta \cos \theta)$;

means for forming a ratio of said first and second equations thereby yielding a third equation;

means for utilizing said third equation to determine $\theta$.

7. A method of determining with a device for measuring magnetic field perturbations the bearing $\theta$ in a plane of an object located in a region subject to an external magnetic field of known strength and direction within said region and characterized by a magnetic dipole moment, where $\theta$ is the angle between a line from said measuring device to the center of said dipole moment and a first direction, said first direction being the direction of said external magnetic field in said plane at said center, comprising:

determining a first component in said plane of the perturbation of said external magnetic field at the site of said measuring device along said first direction;

determining a second component in said plane of the perturbation of said external magnetic field at the site of said measuring device along a second direction in said plane, wherein said second direction is orthogonal to said first direction;

forming a first equation by setting said first component proportional to $(3 \cos^2 \theta - 1)$;

forming a second equation by setting said second component proportional to $(3 \sin \theta \cos \theta)$;

forming a ratio of said first and second equations thereby yielding a third equation; and utilizing said third equation to determine $\theta$.

8. An apparatus for determining the bearing $\theta$ in a plane of an object located in a region subject to an external magnetic field of known strength and direction within said region and characterized by a magnetic dipole moment, where $\theta$ is the angle between a line from a point in said plane to the center of said dipole moment and a first direction; said first direction being the direction of said external magnetic field in said plane at said center, comprising:

means for determining a first component in said plane of the perturbation of said external magnetic field at said point along said first direction;

means for determining a second component in said plane of the perturbation of said external magnetic field at said point along a second direction in said plane, wherein said second direction is orthogonal to said first direction;

means for forming a first equation by setting said first component proportional to $(3 \cos^2 \theta - 1)$;

means for forming a second equation by setting said second component proportional to $(3 \sin \theta \cos \theta)$;

means for forming a ratio of said first and second equations thereby yielding a third equation;

means for utilizing said third equation to determine $\theta$.

* * * * *